United States Patent
Lin et al.

(10) Patent No.: US 10,448,527 B2
(45) Date of Patent: Oct. 15, 2019

(54) FOLDABLE DISPLAY DEVICE

(71) Applicant: E Ink Holdings Inc., Hsinchu (TW)

(72) Inventors: Yi-Sheng Lin, Hsinchu (TW);
Chia-Chun Yeh, Hsinchu (TW);
Kuo-Hsing Cheng, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 16/018,030

(22) Filed: Jun. 25, 2018

(65) Prior Publication Data
US 2019/0014674 A1    Jan. 10, 2019

(30) Foreign Application Priority Data

Jul. 7, 2017 (CN) .......................... 2017 1 0552033

(51) Int. Cl.
| H05K 7/02 | (2006.01) |
| H05K 7/04 | (2006.01) |
| H05K 5/02 | (2006.01) |
| H05K 5/00 | (2006.01) |
| E05D 3/18 | (2006.01) |
| E05D 7/00 | (2006.01) |
| G06F 1/16 | (2006.01) |

(52) U.S. Cl.
CPC ............ *H05K 5/0226* (2013.01); *E05D 3/18* (2013.01); *E05D 7/00* (2013.01); *G06F 1/1652* (2013.01); *G06F 1/1681* (2013.01); *H05K 5/0017* (2013.01); *E05Y 2900/606* (2013.01)

(58) Field of Classification Search
USPC ................................................. 361/807, 755
See application file for complete search history.

(56) References Cited

U.S. PATENT DOCUMENTS

| 8,727,601 | B2 | 5/2014 | Wang et al. |
| 8,804,349 | B2 | 8/2014 | Lee et al. |
| 9,164,547 | B1 | 10/2015 | Kwon et al. |
| 9,311,843 | B2 | 4/2016 | Kim et al. |
| 9,348,362 | B2 | 5/2016 | Ko et al. |
| 9,348,369 | B2 | 5/2016 | Kee et al. |
| 10,082,838 | B1 * | 9/2018 | Hong .................... G06F 1/1681 |
| 2012/0182677 | A1 | 7/2012 | Seo |

(Continued)

FOREIGN PATENT DOCUMENTS

| CN | 201178431 Y | 1/2009 |
| CN | 103927940 A | 7/2014 |

(Continued)

OTHER PUBLICATIONS

Corresponding Taiwan office action dated Mar. 2, 2018.

*Primary Examiner* — Hung S. Bui
(74) *Attorney, Agent, or Firm* — CKC & Partners Co., LLC

(57) ABSTRACT

A foldable display device includes a display panel having two flat portions and a bend portion between the two flat portions; a hinge substantially aligned with and beneath the bend portion of the display panel; a plurality of slidable platforms between the hinge and a bottom surface of the bend portion of the display panel; and a repeatable adhering component between one of the slidable platforms and the bottom surface of the bend portion of the display panel, wherein the repeatable adhering component comprises a self-adhesive pad or a weak adhesive.

9 Claims, 8 Drawing Sheets

(56) References Cited

U.S. PATENT DOCUMENTS

| | | | |
|---|---|---|---|
| 2015/0055287 A1* | 2/2015 | Seo | G06F 1/1652 361/679.27 |
| 2015/0257289 A1 | 9/2015 | Lee et al. | |
| 2016/0139634 A1 | 5/2016 | Cho et al. | |
| 2018/0124931 A1* | 5/2018 | Choi | G06F 1/1652 |

FOREIGN PATENT DOCUMENTS

| CN | 104851365 A | 8/2015 |
|---|---|---|
| CN | 105516409 A | 4/2016 |
| CN | 105530340 A | 4/2016 |

* cited by examiner

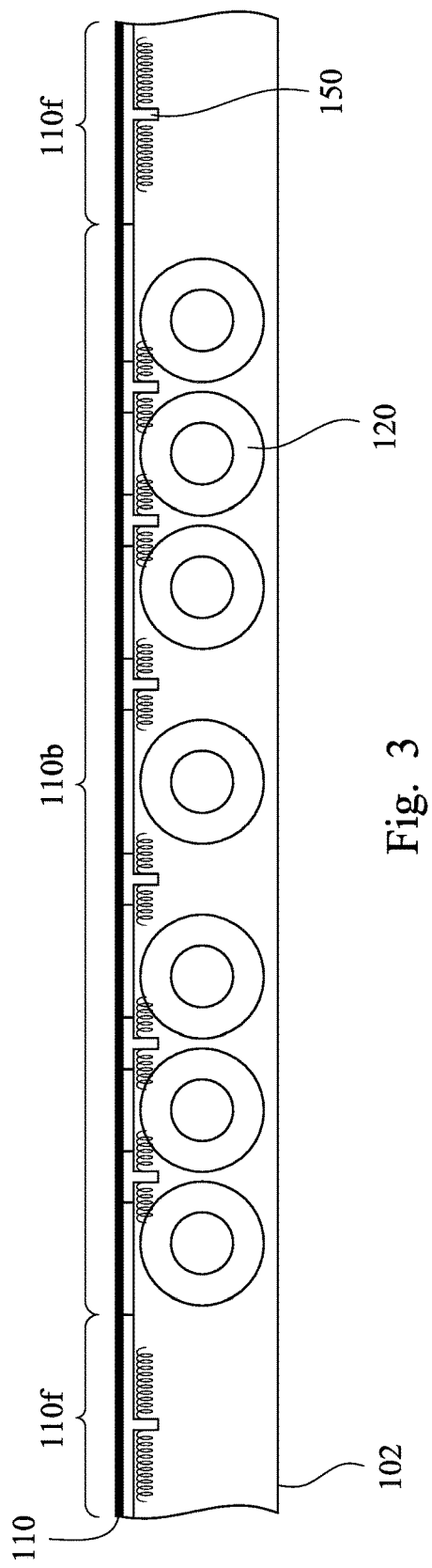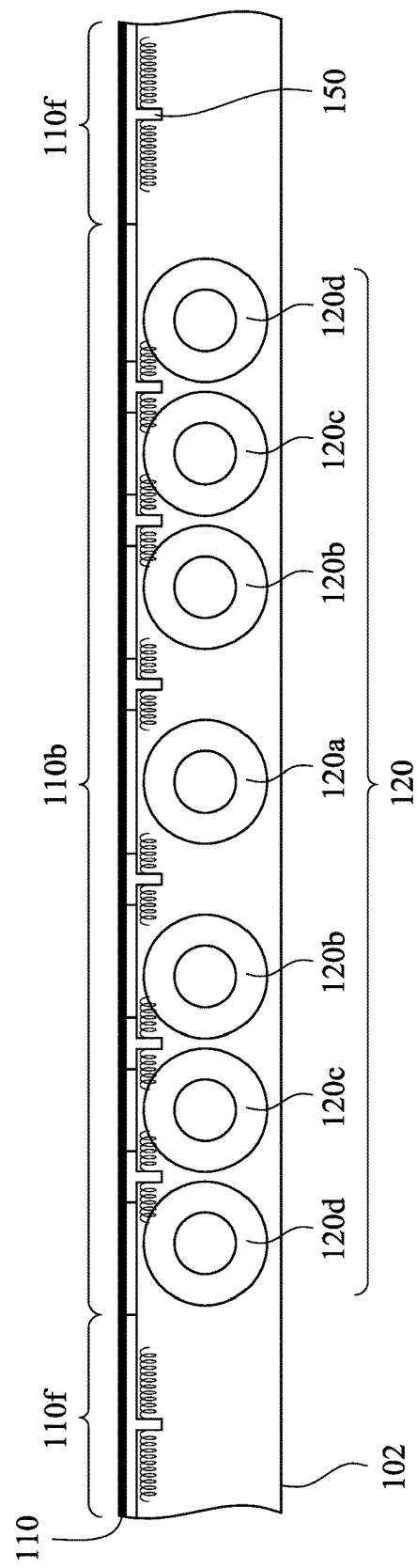

FOLDABLE DISPLAY DEVICE

CROSS-REFERENCE TO RELATED APPLICATION

This application claims priority to China Application Serial Number 201710552033.0, filed Jul. 7, 2017, which is herein incorporated by reference.

BACKGROUND

Field of Invention

The present disclosure relates to a foldable display device.

Description of Related Art

A bend portion of a display panel of a conventional foldable display device is usually free-standing or entirely adhered to a housing. However, these two structures will introduce negative impacts on the display panels. Specifically, when the foldable display device having the free-standing bend portion is bent, the stress will be concentrated on an edge of the free-standing bend portion, which may cause damage to the edge thereof. In another aspect, when the foldable display device having the bend portion entirely adhered to the housing is closed, the compressive stress caused by an inner diameter difference between the display panel and the housing may cause the bend portion to protrude inwardly and to separate from the housing.

SUMMARY

A purpose of the present disclosure is to provide a foldable display device. It is possible to prevent a display panel from being damaged when the foldable display device is bent by disposing a hinge and slidable platforms substantially aligned with a bend portion of the display panel.

The present disclosure provides a foldable display device, which includes: a display panel having two flat portions and a bend portion between the two flat portions; a hinge substantially aligned with and beneath the bend portion of the display panel; and a plurality of slidable platforms between the hinge and a bottom surface of the bend portion of the display panel.

According to some embodiments of the present disclosure, the foldable display device further includes a repeatable adhering component between one of the slidable platforms and the bottom surface of the bend portion of the display panel.

According to some embodiments of the present disclosure, the repeatable adhering component is fixed on the one of the slidable platforms.

According to some embodiments of the present disclosure, the foldable display device further includes a fastening adhesive adjacent to the repeatable adhering component and adhered between the one of the slidable platforms and the bottom surface of the bend portion of the display panel.

According to some embodiments of the present disclosure, the foldable display device further includes a fastening adhesive adhered between one of the slidable platforms and the bottom surface of the bend portion of the display panel.

According to some embodiments of the present disclosure, the foldable display device further includes a support platform beneath one of the two flat portions of the display panel.

According to some embodiments of the present disclosure, the support platform is fixed on a bottom surface of the one of the two flat portions of the display panel.

According to some embodiments of the present disclosure, each of the slidable platforms includes a platform portion and a support portion connected to the platform portion, and the foldable display device further comprises a torsional component in contact with the support portion of one of the slidable platforms, and the torsional component includes a spring, a gear or a combination thereof.

According to some embodiments of the present disclosure, the torsional component comprises the spring over the hinge.

According to some embodiments of the present disclosure, the torsional component comprises the gear adjacent to the hinge.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 3 is a cross-sectional view of a foldable display device according to some embodiments of the present disclosure;

FIG. 4 is a cross-sectional view of a foldable display device according to some embodiments of the present disclosure;

DETAILED DESCRIPTION

Figure 1:
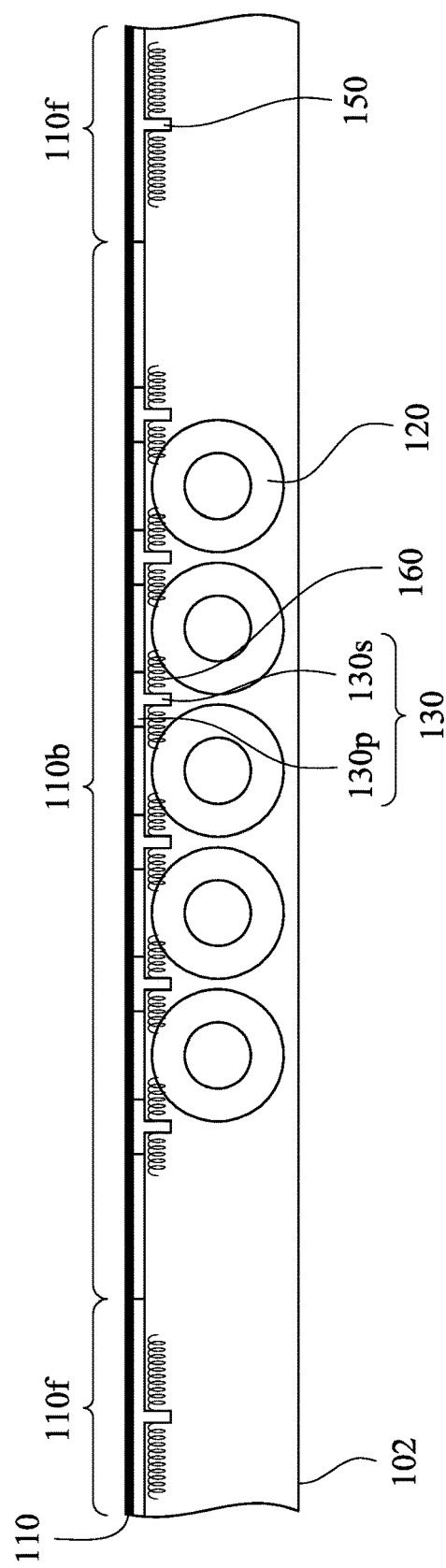
FIG. 1 is a cross-sectional view of a foldable display device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a foldable display device, which includes a display panel, a hinge and a plurality of slidable platforms. The display panel includes a bend portion. The hinge and the slidable platforms are substantially aligned with the bend portion of the display panel. When the foldable display device is bent, the hinge can uniformly disperse the stress of the bend portion, and the slidable platforms can compensate for an inner diameter difference between the display panel and a housing, and thus to avoid damaging the display panel, thereby solving the problems described in the related art. Various embodiments of the foldable display device will be described below in detail.

Figure 2:
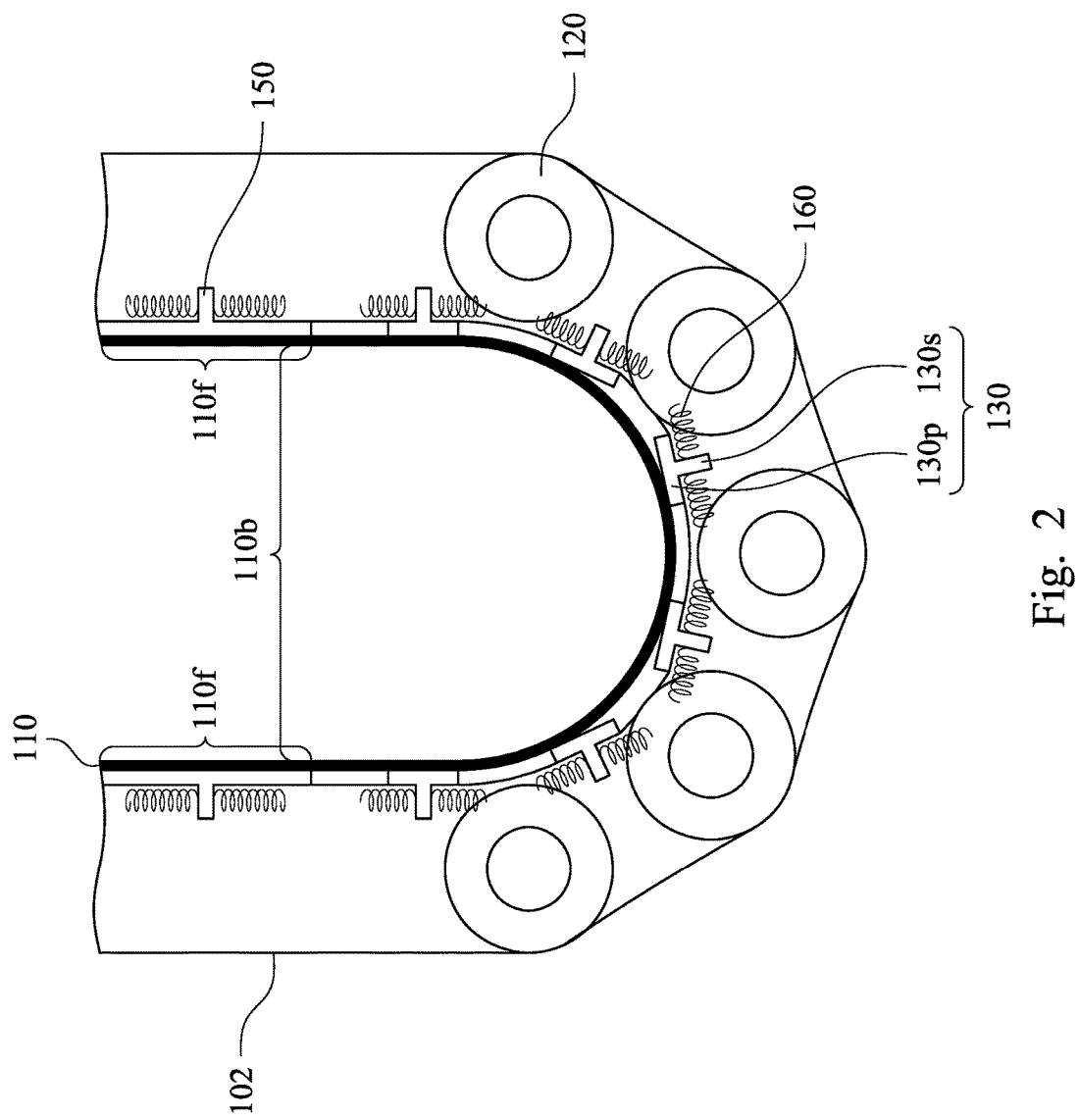
FIG. 2 is a cross-sectional view of a foldable display device after bent according to some embodiments of the present disclosure.

FIG. 1 is a cross-sectional view of a foldable display device according to some embodiments of the present disclosure. FIG. 2 is a cross-sectional view of a foldable display device after bent according to some embodiments of the present disclosure. Referring to FIGS. 1 and 2, the foldable display device includes a display panel 110, a hinge 120 and a plurality of slidable platforms 130.

In some embodiments, as shown in FIGS. 1 and 2, the foldable display device further includes a housing 102. In some embodiments, the hinge 120 and a portion of the slidable platform 130 are disposed in the housing 102. Other components, such as power supplies, circuit boards, support platforms 150 and torsional components 160, may also be disposed in the housing 102.

The display panel 110 has two flat portions 110f and a bend portion 110b. The bend portion 110b is between the two flat portions 110f. In some embodiments, the display panel 110 is a liquid crystal display panel, an organic light emitting display panel or an electrophoretic display panel. In some embodiments, the display panel 110 includes an electronic ink layer. Generally, a size of the flat portion is larger than that of the bend portion. However, as shown in FIGS. 1 and 2, in order to clearly show the bend portion 110b, the size of the flat portions 110f are adjusted (reduced). It is to be understood that the dimensional relationship between the flat portions and the bend portion is not limited to that between the flat portions 110f and the bend portion 110b of FIGS. 1 and 2.

The hinge 120 is substantially aligned with and beneath the bend portion 110b of the display panel 110. The hinge 120 is configured for auxiliary turn to uniformly disperse the stress of the bend portion 110b. In practice, amount, distribution and turn order of hinge portions of the hinge 120, and the torque and turning angle of each of the hinge portions can be appropriately adjusted to effectively and uniformly disperse the stress. In some embodiments, as shown in FIGS. 1 and 2, the hinge 120 has five hinge portions uniformly distributed, and each hinge portion can turn 36 to 45 degrees, and thus to achieve 180-degree bending.

FIG. 3 is a cross-sectional view of a foldable display device according to some embodiments of the present disclosure. In some embodiments, as shown in FIG. 3, the hinge 120 has seven hinge portions, but those are not uniformly distributed. In some embodiments, the hinge portions are densely distributed at the edge of the bend portion 110b, which has larger stress when bent, and thus to effectively disperse the stress at there.

FIG. 4 is a cross-sectional view of a foldable display device according to some embodiments of the present disclosure. In some embodiments, as shown in FIG. 4, the hinge 120 has seven hinge portions 120d, 120c, 120b, 120a, 120b, 120c, 120d, but those are not uniformly distributed. In some embodiments, the torque relationship of the hinge portions is: hinge portion 120a>hinge portion 120b>hinge portion 120c>hinge portion 120d, and thus the hinge portion 120d firstly turns when the foldable display device is bent. In some embodiments, the torque relationship of the hinge portions is: hinge portion 120d>hinge portion 120c>hinge portion 120b>hinge portion 120a, and thus the hinge portion 120a firstly turns when the foldable display device is bent. The turning angles of the hinge portions 120a, 120b, 120c, 120d may be same or different. In some embodiments, the turning angle relationship of the hinge portions is: hinge portion 120a>hinge portion 120b=hinge portion 120c=hinge portion 120d or hinge portion 120a>hinge portion 120b>hinge portion 120c>hinge portion 120d.

Still referring to FIGS. 1 and 2, the slidable platform 130 is disposed between the hinge 120 and a bottom surface of the bend portion 110b of the display panel 110. When the foldable display device is bent, the slidable platforms 130 can compensate for an inner diameter difference between the display panel 110 and the housing 102. In some embodiments, the slidable platform 130 is T-shaped. In other embodiments, the slidable platform 130 may have other shapes, such as 7-shape. In some embodiments, each slidable platform 130 includes a platform portion 130p and a support portion 130s. The platform portion 130p is adjacent to a portion of the bend portion 110b of the display panel 110. The support portion 130s is connected to the platform portion 130p to support thereto. In some embodiments, the support portion 130s is I-shaped. In other embodiments, the support portion 130s may have other shapes, such as L-shape or X-shape.

In some embodiments, as shown in FIGS. 1 and 2, the foldable display device further includes two support platforms 150 respectively disposed beneath the two flat portions 110f of the display panel 110. In some embodiments, the two support platforms 150 are respectively fixed on bottom surfaces of the two flat portions 110f of the display panel 110. In some embodiments, the support platform 150 is fixed on the bottom surface of the flat portion 110f through a fastening adhesive (not shown). In some embodiments, the fastening adhesive is a panel fixing adhesive or other suitable materials.

In some embodiments, as shown in FIGS. 1 and 2, the foldable display device further includes a torsional component 160 in contact with the support portion 130s of the slidable platform 130. In some embodiments, the torsional component 160 includes a spring, a gear or a combination thereof.

Figure 5:
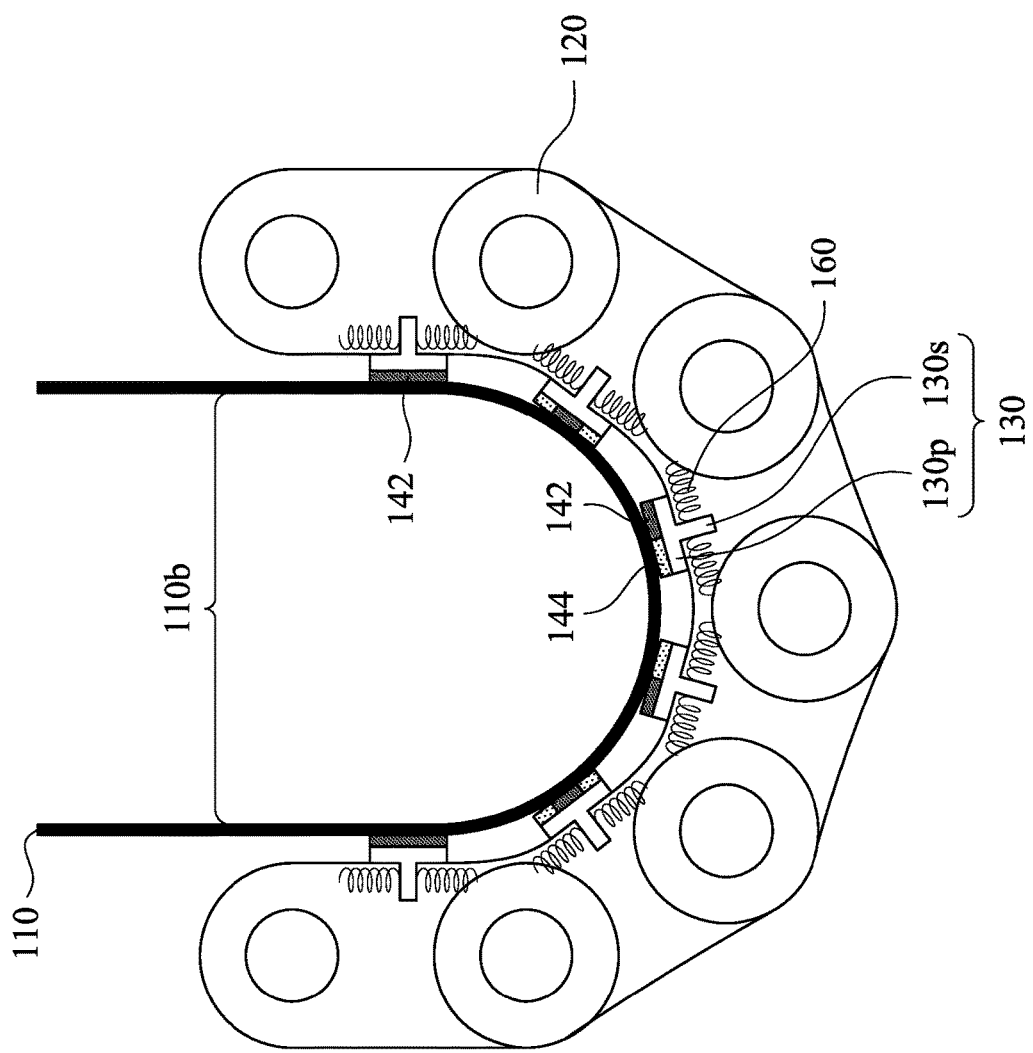
FIG. 5 is a cross-sectional view of a foldable display device after bent according to some embodiments of the present disclosure.

FIG. 5 is a cross-sectional view of a foldable display device after bent according to some embodiments of the present disclosure. In some embodiments, as shown in FIG. 5, the foldable display device further includes a repeatable adhering component 144 between one of the slidable platforms 130 and the bottom surface of the bend portion 110b of the display panel 110. The repeatable adhering component 144 facilitates the bend portion 110b being attracted to the slidable platform 130 when the display panel 110 is opened. In some embodiments, there is a low adhesive strength between a surface of the repeatable adhering component 144 near the bend portion 110b and the bottom surface of the bend portion 110b, and thus the surface of the repeatable adhering component 144 can be repeatedly adhered to the bottom surface of the bend portion 110b. In some embodiments, the repeatable adhering component 144 is a self-adhesive pad or a weak adhesive which peels off without trace. In some embodiments, the repeatable adhering component 144 includes silicone or other suitable materials. In some embodiments, the repeatable adhering component 144 is a silicone pad.

In some embodiments, the repeatable adhering component 144 is fixed on the slidable platform 130. In some embodiments, the repeatable adhering component 144 is fixed on the platform portion 130p of the slidable platform 130. In some embodiments, there is a larger adhesive strength between a surface of the repeatable adhering component 144 near the platform portion 130p and the platform portion 130p.

In some embodiments, the foldable display device further includes a fastening adhesive 142 adhered between the slidable platform 130 and the bottom surface of the bend portion 110b of the display panel 110. In some embodiments, the fastening adhesive 142 is adjacent to the repeatable adhering component 144. In some embodiments, the fastening adhesive 142 is a panel fixing adhesive. In practice, the distribution, position and area of the fastening adhesive 142 and the repeatable adhering component 144 may be appropriately adjusted, and thus to let the display panel 110 be able to be naturally bent.

Figure 6:
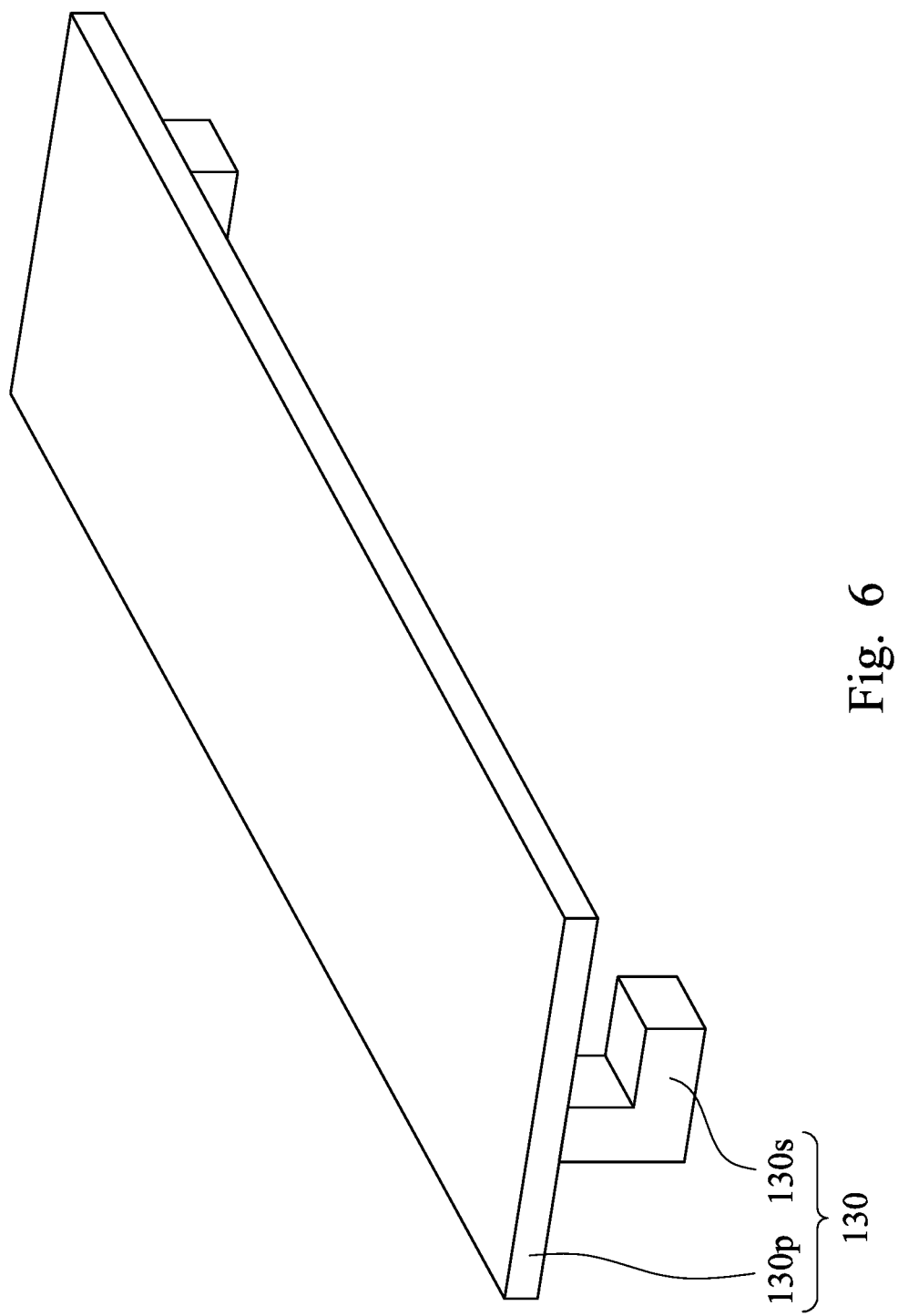
FIG. 6 is a three dimensional view of a slidable platform according to some embodiments of the present disclosure.

FIG. 6 is a three dimensional view of a slidable platform according to some embodiments of the present disclosure. The slidable platform 130 includes a platform portion 130p and two support portions 130s. In some embodiments, the support portion 130s is L-shaped.

Figure 7:
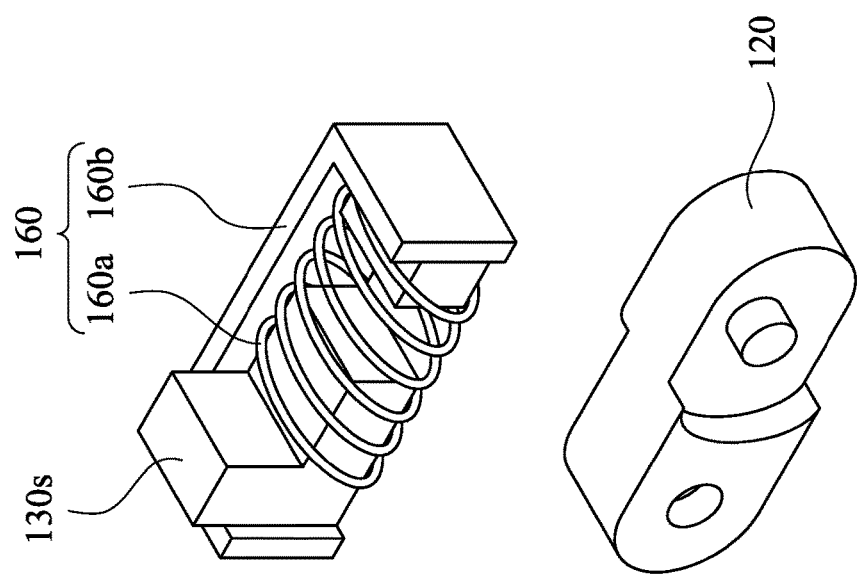
FIG. 7 is an assembly view of a slidable platform having a support portion, a torsional component and a hinge according to some embodiments of the present disclosure.

FIG. 7 is an assembly view of a slidable platform having a support portion, a torsional component and a hinge according to some embodiments of the present disclosure. In some embodiments, as show in FIG. 7, the torsional component 160 includes a spring 160a and a carrier 160b. In some embodiments, the support portion 130s is fixed on the carrier 160b. In some embodiments, the carrier 160b has a protrusion (not marked) corresponding to an end of the support portion 130s. In some embodiments, both ends of the spring 160a are respectively in contact with the protrusion of the carrier 160b and the end of the support portion 130s. In some embodiments, the spring 160a is over the hinge 120. In some embodiments, the carrier 160b is fixed on the hinge 120. In some embodiments, a bottom surface of the carrier 160b is adhered to the hinge 120.

Figure 8:
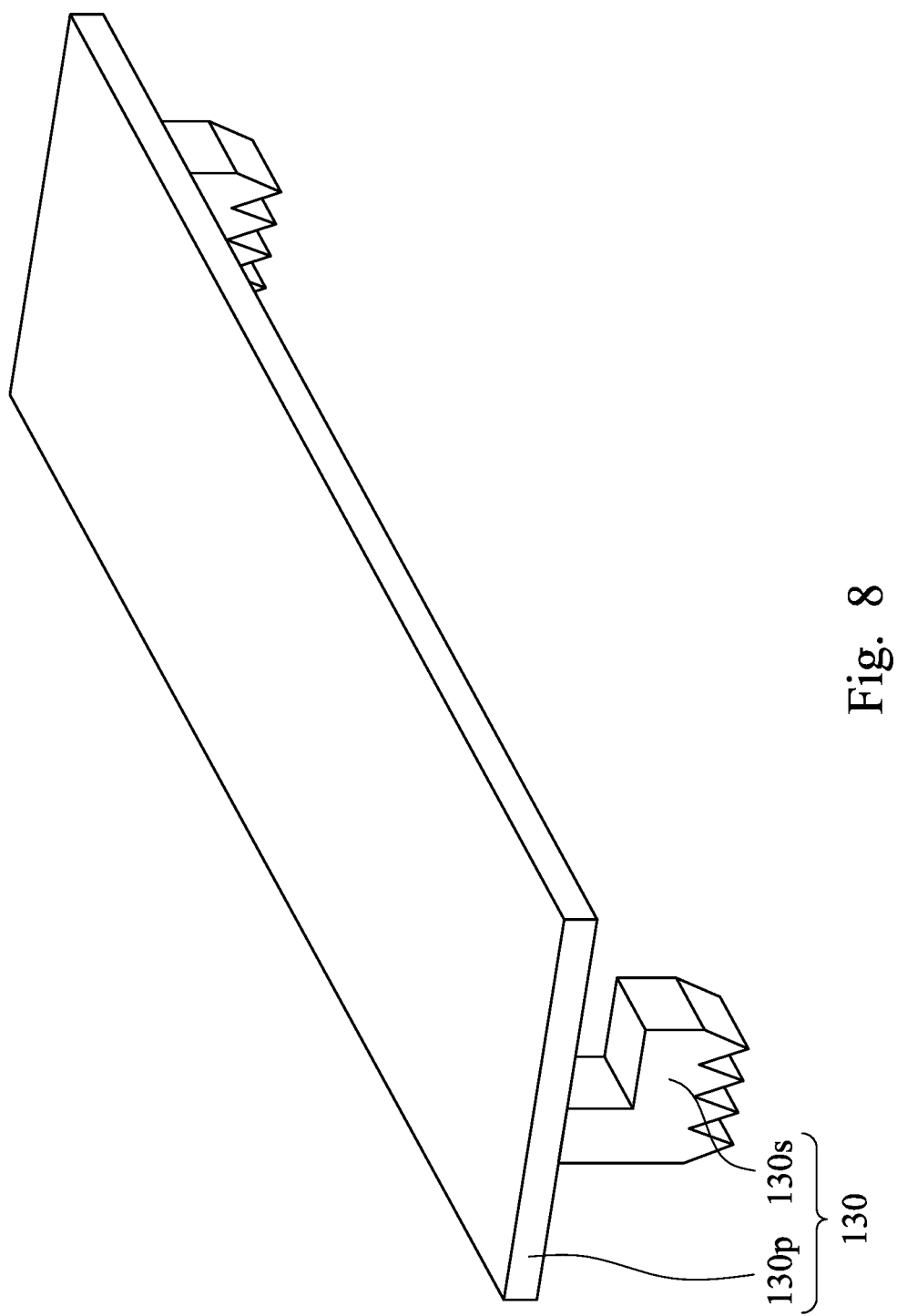
FIG. 8 is a three dimensional view of a slidable platform according to some embodiments of the present disclosure.

FIG. 8 is a three dimensional view of a slidable platform according to some embodiments of the present disclosure. The slidable platform 130 includes a platform portion 130p and two support portions 130s. In some embodiments, the support portion 130s is L-shaped. In some embodiments, a bottom surface of the support portion 130s is serrated.

Figure 9:
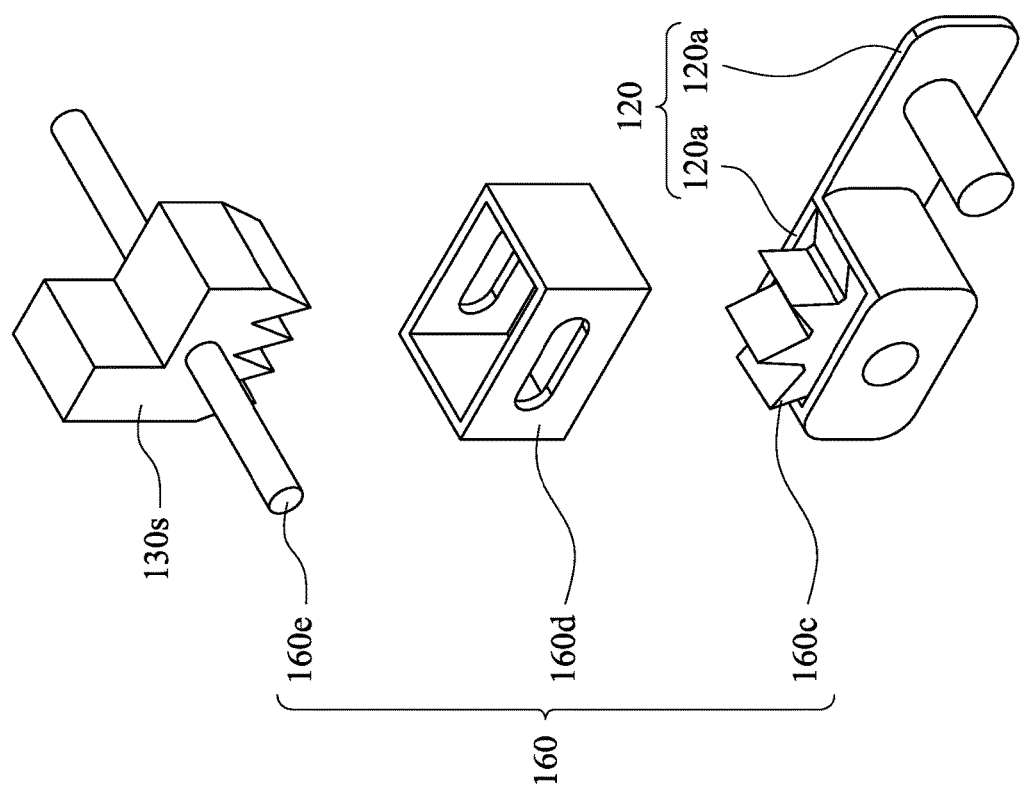
FIG. 9 is an assembly view of a slidable platform having a support portion, a torsional component and a hinge according to some embodiments of the present disclosure.

FIG. 9 is an assembly view of a slidable platform having a support portion, a torsional component and a hinge according to some embodiments of the present disclosure. In some embodiments, as shown in FIG. 9, the torsional component 160 includes a gear 160c, a carrier 160d and a fixed shaft 160e. In some embodiments, the gear 160c is adjacent to the hinge 120. In some embodiments, the gear 160c is disposed between two hinge portions 120a. For the sake of brevity, FIG. 9 only shows a portion of the left hinge portion 120a.

In some embodiments, the support portion 130s of the slidable platform is disposed in the carrier 160d, and the support portion 130s is fixed in the carrier 160d by the fixed shaft 160e through the support portion 130s and an opening of the carrier 160d. In some embodiments, the carrier 160d is fixed on the hinge 120. In some embodiments, a bottom surface of the carrier 160d is adhered to the hinge 120.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A foldable display device, comprising:
   a display panel having two flat portions and a bend portion between the two flat portions;
   a hinge substantially aligned with and beneath the bend portion of the display panel;
   a plurality of slidable platforms between the hinge and a bottom surface of the bend portion of the display panel; and
   a repeatable adhering component between one of the slidable platforms and the bottom surface of the bend portion of the display panel, wherein the repeatable adhering component comprises a self-adhesive pad or a weak adhesive.

2. The foldable display device of claim 1, wherein the repeatable adhering component is fixed on the one of the slidable platforms.

3. The foldable display device of claim 1, further comprising a fastening adhesive adjacent to the repeatable adhering component and adhered between the one of the slidable platforms and the bottom surface of the bend portion of the display panel.

4. The foldable display device of claim 1, further comprising a fastening adhesive adhered between one of the slidable platforms and the bottom surface of the bend portion of the display panel.

5. The foldable display device of claim 1, further comprising a support platform beneath one of the two flat portions of the display panel.

6. The foldable display device of claim 5, wherein the support platform is fixed on a bottom surface of the one of the two flat portions of the display panel.

7. The foldable display device of claim 1, wherein each of the slidable platforms comprises a platform portion and a support portion connected to the platform portion, and the foldable display device further comprises a torsional component in contact with the support portion of one of the slidable platforms, and the torsional component comprises a spring, a gear or a combination thereof.

8. The foldable display device of claim 7, wherein the torsional component comprises the spring over the hinge.

9. The foldable display device of claim 7, wherein the torsional component comprises the gear adjacent to the hinge.

* * * * *